(12) United States Patent
Moriguchi et al.

(10) Patent No.: US 8,957,418 B2
(45) Date of Patent: Feb. 17, 2015

(54) SEMICONDUCTOR DEVICE AND DISPLAY APPARATUS

(75) Inventors: Masao Moriguchi, Osaka (JP); Yohsuke Kanzaki, Osaka (JP); Yudai Takanishi, Osaka (JP); Takatsugu Kusumi, Osaka (JP); Hiroshi Matsukizono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/992,367

(22) PCT Filed: Dec. 6, 2011

(86) PCT No.: PCT/JP2011/078202
§ 371 (c)(1),
(2), (4) Date: Jun. 27, 2013

(87) PCT Pub. No.: WO2012/077682
PCT Pub. Date: Jun. 14, 2012

(65) Prior Publication Data
US 2013/0285054 A1    Oct. 31, 2013

(30) Foreign Application Priority Data

Dec. 8, 2010   (JP) ................................ 2010-273934

(51) Int. Cl.
*H01L 21/46*   (2006.01)
*H01L 27/15*   (2006.01)
(Continued)

(52) U.S. Cl.
CPC ............ *H01L 27/15* (2013.01); *H01L 27/1225* (2013.01); *H01L 29/7869* (2013.01);
(Continued)

(58) Field of Classification Search
USPC ............................................ 257/43; 438/435
See application file for complete search history.

(56) References Cited

U.S. PATENT DOCUMENTS 6,265,249 B1 * 7/2001 Wu ................................ 438/158
6,638,846 B2 * 10/2003 Iwata et al. .................... 438/608
(Continued)

FOREIGN PATENT DOCUMENTS

JP    2003-298062 A    10/2003
JP    2004-348144 A    12/2004
(Continued)

OTHER PUBLICATIONS

Official Communication issued in International Patent Application No. PCT/JP2011/078202, mailed on Jan. 31, 2012.
(Continued)

*Primary Examiner* — Jarrett Stark
*Assistant Examiner* — Charles N Ausar-El
(74) *Attorney, Agent, or Firm* — Keating & Bennett, LLP

(57) ABSTRACT

A semiconductor device according to the present invention includes: a gate electrode (62) of a thin film transistor (10) and an oxygen supply layer (64), the gate electrode (62) and the oxygen supply layer (64) being formed on a substrate (60); a gate insulating layer (66) formed on the gate electrode (62) and the oxygen supply layer (64); an oxide semiconductor layer (68) of the thin film transistor (10), the oxide semiconductor layer (68) being formed on the gate insulating layer (66); and a source electrode (70S) and a drain electrode (70*d*) of the thin film transistor (10), the source electrode (70S) and the drain electrode (70*d*) being formed on the gate insulating layer (66) and the oxide semiconductor layer (68).

7 Claims, 12 Drawing Sheets

(51) Int. Cl.
*H01L 27/12* (2006.01)
*H01L 29/786* (2006.01)
*H01L 29/49* (2006.01)
*H01L 29/66* (2006.01)
*H01L 27/32* (2006.01)
*G02F 1/1368* (2006.01)

(52) U.S. Cl.
CPC ............ *H01L21/46* (2013.01); *H01L 29/4908* (2013.01); *H01L 29/66742* (2013.01); *H01L 29/78606* (2013.01); *H01L 27/3262* (2013.01); *G02F 1/1368* (2013.01)
USPC ........................................... 257/43; 438/435

(56) References Cited

U.S. PATENT DOCUMENTS

| | | | |
|---|---|---|---|
| 8,344,374 B2 * | 1/2013 | Yamazaki et al. | 257/43 |
| 8,378,348 B2 * | 2/2013 | Saito et al. | 257/59 |
| 8,389,417 B2 * | 3/2013 | Yamazaki et al. | 438/722 |
| 8,410,002 B2 * | 4/2013 | Yamazaki et al. | 438/770 |
| 8,421,083 B2 * | 4/2013 | Yamazaki et al. | 257/71 |
| 8,748,881 B2 * | 6/2014 | Yamazaki | 257/43 |
| 2003/0157283 A1 * | 8/2003 | Tai et al. | 428/35.7 |
| 2006/0110867 A1 | 5/2006 | Yabuta et al. | |
| 2008/0315203 A1 * | 12/2008 | Hino et al. | 257/59 |
| 2010/0051949 A1 * | 3/2010 | Yamazaki et al. | 257/57 |
| 2010/0055868 A1 * | 3/2010 | Lee et al. | 438/435 |
| 2010/0133530 A1 * | 6/2010 | Akimoto et al. | 257/43 |
| 2010/0187644 A1 * | 7/2010 | Nabatame | 257/411 |
| 2010/0213531 A1 | 8/2010 | Asami et al. | |
| 2010/0308325 A1 * | 12/2010 | Imai | 257/43 |
| 2011/0108837 A1 * | 5/2011 | Yamazaki et al. | 257/43 |
| 2011/0109351 A1 * | 5/2011 | Yamazaki et al. | 327/109 |
| 2011/0114943 A1 * | 5/2011 | Yamazaki et al. | 257/43 |
| 2011/0114945 A1 * | 5/2011 | Yamazaki et al. | 257/43 |
| 2011/0127523 A1 * | 6/2011 | Yamazaki | 257/43 |

FOREIGN PATENT DOCUMENTS

| | | |
|---|---|---|
| JP | 2005-210000 A | 8/2005 |
| JP | 2006-165531 A | 6/2006 |
| JP | 2008-170664 A | 7/2008 |
| JP | 2009-194208 A | 8/2009 |
| JP | 2010-080952 A | 4/2010 |
| JP | 2010-219511 A | 9/2010 |
| WO | WO2009093410 * | 7/2009 |
| WO | WO 2009093410 A1 * | 7/2009 |

OTHER PUBLICATIONS

English translation of Official Communication issued in corresponding International Application PCT/JP2011/078202, mailed on Jun. 20, 2013.

* cited by examiner (a)

(b)

(a)

(b)

SEMICONDUCTOR DEVICE AND DISPLAY APPARATUS

TECHNICAL FIELD

The present invention relates to a semiconductor device and display device having a thin film transistor.

BACKGROUND ART

Generally speaking, a liquid crystal display device or an organic EL (Electro Luminescence) display device of an active matrix type includes: a substrate on which a thin film transistor (Thin Film Transistor; hereinafter also referred to as "TFT") is formed as a switching element for each pixel (hereinafter also referred to as "TFT substrate"); a counter substrate on which a counter electrode, color filters, and the like are formed; and an optical modulation layer, e.g., a liquid crystal layer, provided between the TFT substrate and the counter substrate.

On the TFT substrate, a plurality of source lines, a plurality of gate lines, and a plurality of TFTs respectively disposed at intersections therebetween, pixel electrodes for applying a voltage across the optical modulation layer such as a liquid crystal layer, storage capacitor lines and storage capacitor electrodes, and the like are formed.

The construction of a TFT substrate is disclosed in Patent Document 1, for example. Hereinafter, with reference to the drawings, the construction of a TFT substrate disclosed in Patent Document 1 will be described.

FIG. 16(a) is a schematic plan view showing the TFT substrate in outline, and the FIG. 16(b) is an enlarged plan view showing one pixel of the TFT substrate. FIG. 17 is a cross-sectional view of a TFT and terminal portions of the semiconductor device shown in FIG. 16.

As shown in FIG. 16(a), the TFT substrate includes a plurality of gate lines 2016 and a plurality of source lines 2017. Each region 2021 surrounded by these lines 2016 and 2017 defines a "pixel". In a region 2040 of the TFT substrate other than the region (displaying region) where the pixels are formed, a plurality of connecting portions 2041 for allowing the plurality of gate lines 2016 and source lines 2017 to be respectively connected to a driving circuit are provided. Each connecting portion 2041 constitutes a terminal portion for providing connection to external wiring.

As shown in FIG. 16(b) and FIG. 17, a pixel electrode 2020 is provided so as to cover each region 2021 defining a pixel. Moreover, a TFT is formed in each region 2021. The TFT includes a gate electrode G, gate insulating films 2025 and 2026 covering the gate electrode G, a semiconductor layer 2019 disposed on the gate insulating film 2026, and a source electrode S and a drain electrode D respectively connected to both end portions of the semiconductor layer 2019. The TFT is covered by a protection film 2028. An interlayer insulating film 2029 is formed between the protection film 2028 and the pixel electrode 2020. The source electrode S of the TFT is connected to a source line 2017, whereas the gate electrode G is connected to a gate line 2016. The drain electrode D is connected to the pixel electrode 2020 within a contact hole 2030.

Moreover, a storage capacitor line 2018 is formed in parallel to the gate line 2016. The storage capacitor line 2018 is connected to a storage capacitor. Herein, the storage capacitor is composed of a storage capacitor electrode 2018b which is made of the same conductive film as the drain electrode D, a storage capacitor electrode 2018a which is made of the same conductive film as the gate line 2016, and the gate insulating film 2026 interposed therebetween.

On the connecting portion 2041 extending from each gate line 2016 or source line 2017, the gate insulating films 2025 and 2026 and the protection film 2028 are not formed, but a connection line 2044 is formed so as to be in contact with an upper face of the connecting portion 2041. As a result, electrical connection between the connecting portion 2041 and the connection line 2044 is ensured.

As shown in FIG. 17, in the liquid crystal display device, the TFT substrate is disposed so as to oppose a substrate 2014 on which a counter electrode and color filters are formed, with a liquid crystal layer 2016 interposed therebetween.

When fabricating such a TFT substrate, the regions 2021 to become pixels (also referred to as "pixel portions") and the terminal portions are preferably formed through a common process, so as to reduce increase in the number of masks and the number of steps.

In order to fabricate the aforementioned TFT substrate, it is necessary to etch away the portions of the gate insulating films 2025 and 2026 and the protection film 2028 that are located in the terminal deployment region 2040, and the portions of the gate insulating film 2025 and the protection film 2028 that are located in the regions where the storage capacitors are to be formed. Patent Document 1 discloses forming an interlayer insulating film 2029 by using an organic insulating film, and by using this as a mask, etching the insulating films 2025 and 2026 and the protection film 2028.

In the recent years, it has been proposed to form a channel layer of a TFT by using an oxide semiconductor film such as IGZO (InGaZnO$_x$), instead of a silicon semiconductor film. Such a TFT is referred to as an "oxide semiconductor TFT". An oxide semiconductor has higher mobility than does amorphous silicon. Therefore, an oxide semiconductor TFT is able to operate more rapidly than an amorphous silicon TFT. Moreover, an oxide semiconductor film is formed through simpler processes than those of a polycrystalline silicon film, and therefore is also applicable to devices which require a large area.

Patent Document 2 describes an example of an oxide semiconductor TFT. Patent Document 3 describes an example of a field-effect transistor having an active layer of an amorphous oxide semiconductor.

For forming an amorphous oxide semiconductor layer, Patent Document 3 describes, prior to forming an amorphous oxide semiconductor layer on a substrate, irradiating the substrate surface with ultraviolet in an ozone ambient, irradiating the substrate surface with plasma, or cleaning the substrate surface with hydrogen peroxide. Moreover, this document describes: performing a step of forming an active layer containing amorphous oxide in an ambient such as ozone gas or nitrogen oxide gas; after forming amorphous oxide on a substrate, conducting a heat treatment at a temperature which in the case where is higher than the film-formation temperature of the amorphous oxide; and so on.

CITATION LIST

Patent Literature

[Patent Document 1] Japanese Laid-Open Patent Publication No. 2008-170664
[Patent Document 2] Japanese Laid-Open Patent Publication No. 2003-298062
[Patent Document 3] Japanese Laid-Open Patent Publication No. 2006-165531

SUMMARY OF INVENTION

Technical Problem

However, an oxide semiconductor TFT may allow oxygen defects to occur during the production process of the TFT, e.g., a heat treatment step, possibly resulting in a problem of carrier electrons causing an unwanted OFF current. Another problem may be that, in a step of etching the source and drain electrodes and a step of forming an insulating layer thereabove, the oxide semiconductor film under them may undergo reduction or other damages.

As a result of a study by the inventors, it has been found that, in an oxide semiconductor TFT of a construction such that the oxide semiconductor layer is in contact with an underlying gate insulating layer or an overlying protection layer, etc., a defect level due to oxygen defects or the like is prone to occur inside the oxide semiconductor layer, or near an interface between the oxide semiconductor layer and an insulating layer, a protection layer, or the like, thus causing problems such as deterioration in TFT characteristics, lowered reliability, and quality fluctuations.

Patent Document 3 above describes, after forming an amorphous oxide, conducting a heat treatment at a temperature which is higher than the film-formation temperature of the amorphous oxide, and so on, this being in order to obtain a transistor with good characteristics. However, even with such a method, the defect level associated with oxygen defects cannot be reduced, and it is difficult to obtain satisfactory TFT characteristics.

The present invention has been made in view of the above, and aims to produce a semiconductor device with good TFT characteristics by reducing defects occurring in an oxide semiconductor layer of an oxide semiconductor TFT. Moreover, the present invention aims to provide a high-performance display device having such a semiconductor device as the TFT substrate.

Solution to Problem

A semiconductor device according to the present invention is a semiconductor device having a thin film transistor, the semiconductor device comprising: a gate electrode of the thin film transistor and an oxygen supply layer, the gate electrode and the oxygen supply layer being formed on a substrate; a gate insulating layer formed on the gate electrode and the oxygen supply layer; an oxide semiconductor layer of the thin film transistor, the oxide semiconductor layer being formed on the gate insulating layer; and a source electrode and a drain electrode of the thin film transistor, the source electrode and the drain electrode being disposed on the gate insulating layer and the oxide semiconductor layer.

In one embodiment, the oxygen supply layer is a layer made of a material containing water ($H_2O$), an OR group, or an OH group.

In one embodiment, the oxygen supply layer is made of a silicone resin, or a resin material containing a silanol group or an Si—OH group.

In one embodiment, the oxygen supply layer is made of an ester-polymerization resin, or a resin material containing a CO—OR group.

In one embodiment, the oxygen supply layer is made of an acrylic resin or a material containing an SOG material.

In one embodiment, the semiconductor device comprises: a lower connection line made of a same material as the gate electrode; an upper connection line made of a same material as the source electrode and the drain electrode; and a connecting portion to which the upper connection line and the lower connection line are connected, wherein, at the connecting portion, the upper connection line and the lower connection line are connected via a contact hole penetrating through the oxygen supply layer and the gate insulating layer.

In one embodiment, the semiconductor device comprises: a lower connection line made of a same material as the gate electrode; an upper connection line made of a same material as the source electrode and the drain electrode; a protection layer formed on the source electrode and the drain electrode; a conductive layer formed on the protection layer; and a connecting portion to which the upper connection line and the lower connection line are connected, wherein, at the connecting portion, the upper connection line and the lower connection line are connected via the conductive layer formed in a contact hole penetrating through the oxygen supply layer, the gate insulating layer, and the protection layer.

In one embodiment, the semiconductor device comprises: a lower connection line made of a same material as the gate electrode; an upper connection line made of a same material as the source electrode and the drain electrode; a protection layer formed on the source electrode and the drain electrode; a conductive layer formed on the protection layer; and a connecting portion to which the upper connection line and the lower connection line are connected, wherein, at the connecting portion, the upper connection line and the conductive layer are connected via a first contact hole penetrating through the protection layer, and the conductive layer and the lower connection line are connected via a second contact hole penetrating through the protection layer, the gate insulating layer, and the oxygen supply layer.

In one embodiment, the semiconductor device comprises a storage capacitor including: a storage capacitor electrode made of a same material as the gate electrode; and a storage capacitor counter electrode opposing the storage capacitor electrode, the storage capacitor counter electrode being made of a same material as the source electrode and the drain electrode.

In one embodiment, the semiconductor device comprises a second oxygen supply layer formed above the oxide semiconductor layer, the source electrode, and the drain electrode.

In one embodiment, the semiconductor device comprises a protection layer formed between: the oxide semiconductor layer, the source electrode, and the drain electrode; and the second oxygen supply layer.

In one embodiment, the second oxygen supply layer is a layer made of a material containing water ($H_2O$), an OR group, or an OH group.

Another semiconductor device according to the present invention is a semiconductor device having a thin film transistor, comprising: a gate electrode of the thin film transistor, the gate electrode being formed on a substrate; a gate insulating layer formed on the gate electrode; an oxygen supply layer formed on the gate insulating layer; an oxide semiconductor layer of the thin film transistor, the oxide semiconductor layer formed on the oxygen supply layer; and a source electrode and a drain electrode of the thin film transistor, the source electrode and the drain electrode being disposed on the oxide semiconductor layer.

In one embodiment, an aperture is formed in the oxygen supply layer; and the oxide semiconductor layer is in contact with the gate insulating layer in the aperture of the oxygen supply layer.

In one embodiment, the oxygen supply layer is a layer made of a material containing water ($H_2O$), an OR group, or an OH group.

In one embodiment, the oxygen supply layer is made of a silicone resin, or a resin material containing a silanol group or an Si—OH group.

In one embodiment, the oxygen supply layer is made of an ester-polymerization resin, or a resin material containing a CO—OR group.

In one embodiment, the oxygen supply layer is made of an acrylic resin or a material containing an SOG material.

A display device according to the present invention is a display device comprising the above semiconductor device.

Advantageous Effects of Invention

According to the present invention, $H_2O$, an OR group, or an OH group is supplied from an oxygen supply layer to an oxide semiconductor layer, whereby a high-performance semiconductor device having an oxide semiconductor layer whose defects are better restored can be provided. Moreover, according to the present invention, a highly-reliable semiconductor device with little variation for each TFT characteristic can be obtained. Moreover, according to the present invention, high-quality displaying can be provided by a display device having an oxide semiconductor TFT with good characteristics.

DESCRIPTION OF EMBODIMENTS

Hereinafter, with reference to the drawings, display devices and semiconductor devices according to embodiments of the present invention will be described. However, the scope of the invention is not to be limited to the following embodiments. The semiconductor device of the present invention is a TFT substrate on which an oxide semiconductor TFT is formed, and broadly encompasses TFT substrates of various display devices, electronic devices, and the like. In the description of the present embodiment, the semiconductor device will be illustrated as a TFT substrate of a display device having oxide semiconductor TFTs as switching elements.

Embodiment 1

Figure 1:
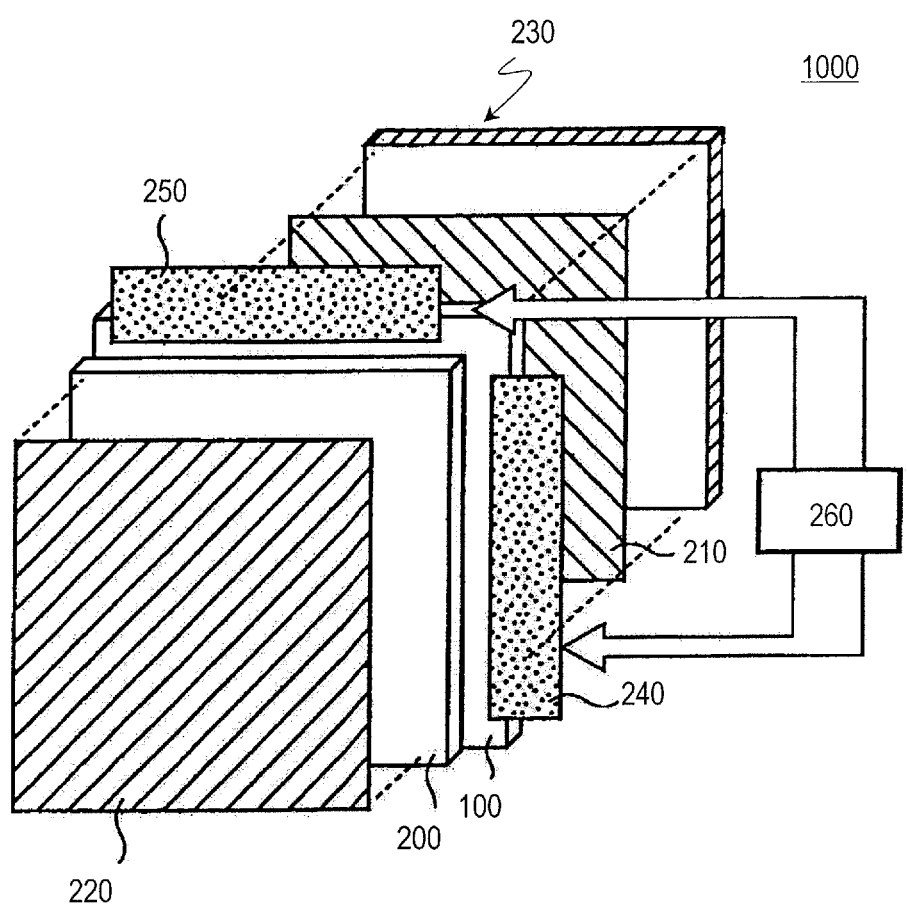
FIG. 1 A perspective view schematically showing the construction of a liquid crystal display device 1000 according to Embodiment 1 of the present invention.

FIG. 1 is a perspective view schematically showing the construction of a liquid crystal display device 1000 according to Embodiment 1 of the present invention.

As shown in FIG. 1, the liquid crystal display device 1000 include: a TFT substrate (semiconductor device) 100 and a counter substrate 200, which oppose each other with a liquid crystal layer interposed therebetween; polarizers 210 and 220 provided respectively outside the TFT substrate 100 and the counter substrate 200; and a backlight unit 230 which emits light for displaying toward the TFT substrate 100. On the TFT substrate 100, a scanning line driving circuit 240 for driving a plurality of scanning lines (gate bus lines) and a signal line driving circuit 250 for driving a plurality of signal lines (data bus lines) are disposed. The scanning line driving circuit 240 and the signal line driving circuit 250 are connected to a control circuit 260 which is internal or external to the TFT substrate 100. Under control of the control circuit 260, scanning signals for switching the TFTs ON/OFF are supplied from the scanning line driving circuit 240 to the plurality of scanning lines, and display signals (applied voltages to the pixel electrodes 20 shown in FIG. 3) are supplied from the signal line driving circuit 250 to the plurality of signal lines.

The counter substrate 200 includes color filters and a common electrode. In the case of displaying in three primary colors, the color filters include an R (red) filter, a G (green) filter, and a B (blue) filter each provided corresponding to a pixel. The common electrode is formed so as to cover the plurality of pixel electrodes 20, with the liquid crystal layer interposed therebetween. In accordance with a potential difference applied between the common electrode and each pixel electrode 20, the liquid crystal molecules between the electrodes become aligned for the respective pixel, whereby displaying is performed.

Figure 2:
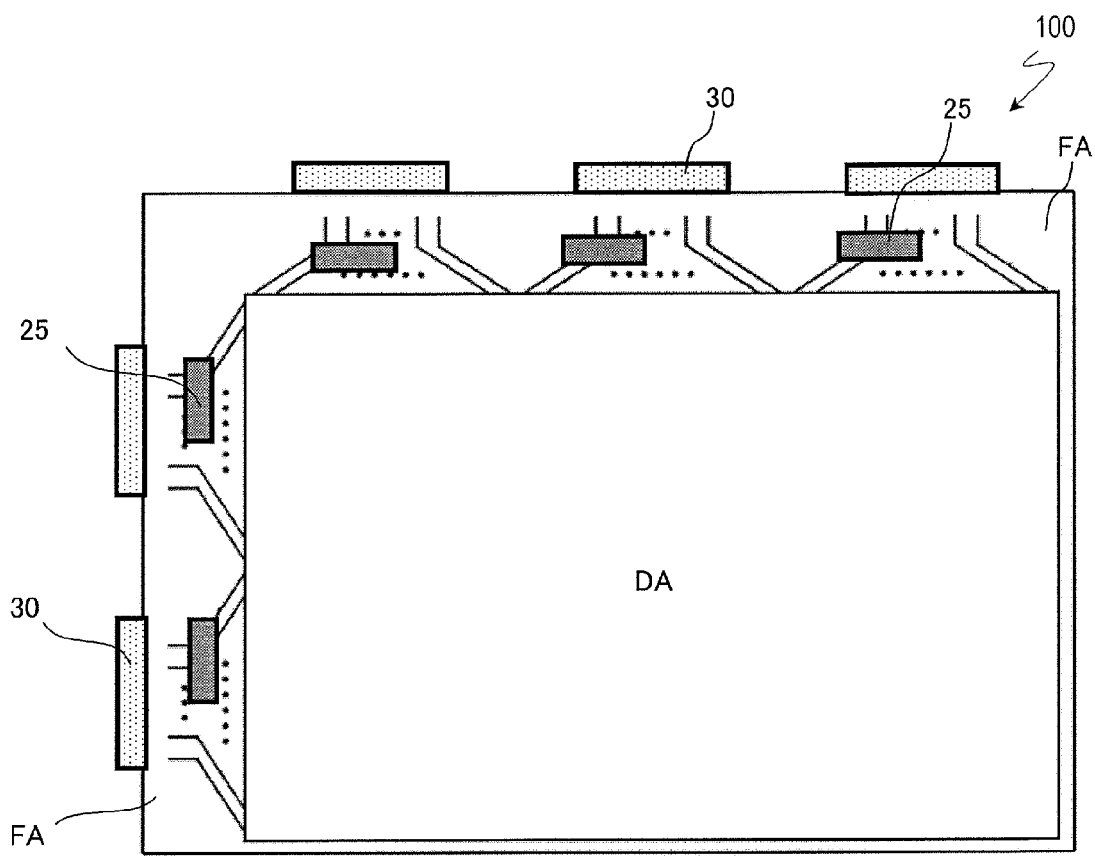
FIG. 2 A plan view schematically showing the construction of a TFT substrate (semiconductor device 100) of the liquid crystal display device 1000.
Figure 3:
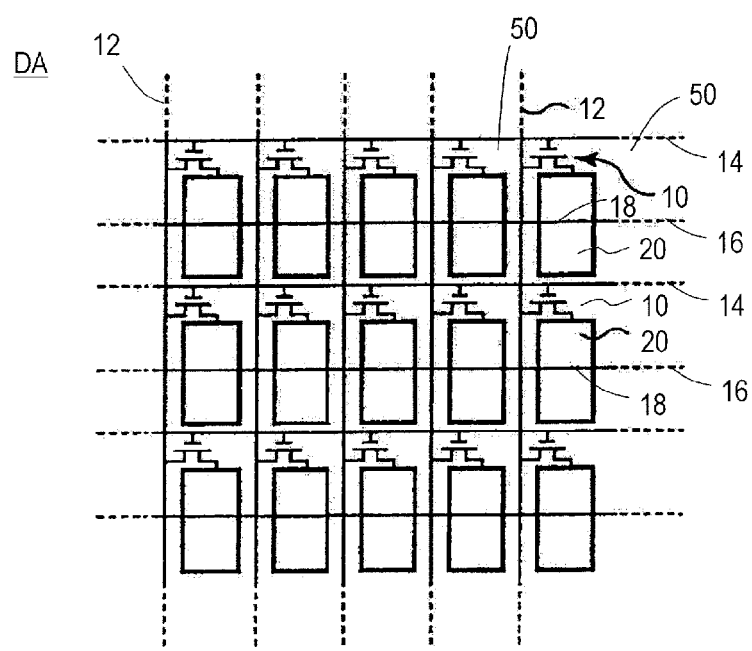
FIG. 3 A plan view schematically showing the construction of a displaying region DA of the TFT substrate 100.

FIG. 2 is a plan view schematically showing the construction of the TFT substrate 100, and FIG. 3 is a plan view schematically showing the construction of a displaying region DA of the TFT substrate 100.

As shown in FIG. 2, the TFT substrate 100 has the display section DA and a peripheral portion FA located outside the display section DA. In the peripheral portion FA, electrical elements such as the scanning line driving circuit 240, the signal line driving circuit 250, and voltage supply circuits are disposed in COG (Chip on Glass) fashion. The electrical elements such as TFTs or diodes in the peripheral portion FA may be formed through the same production steps as the TFTs in the display section DA. Moreover, terminal portions 30 are provided near outer ends of the peripheral portion FA for attaching external devices, e.g., FPCs (Flexible Printed Circuits). Furthermore, connecting portions 25 for electrically connecting upper connection lines such as signal lines and lower connection lines such as scanning lines are provided in the peripheral portion FA.

Although not shown, a plurality of connection lines are formed at the boundary between the displaying region DA and the peripheral region FA. Each signal line 12 is electrically connected to a connection line via a correspondingly-formed connecting portion. Via the connecting portion, a signal line 12 as the upper connection line is connected to a connection line as the lower connection line.

As shown in FIG. 3, a plurality of pixels 50 are arranged in a matrix array in the display section DA, and a plurality of scanning lines 14 and a plurality of signal lines 12 are disposed orthogonal to one another. The scanning lines 14 partly constitute gate electrodes of the TFTs 10. Near each of the intersections between the plurality of scanning lines 14 and the plurality of signal lines 12, a thin film transistor (TFT) 10 is formed as an active element for each pixel 50. In each pixel 50, a pixel electrode 20 which is made of e.g. ITO (Indium Tin Oxide) is disposed, the pixel electrode 20 being electrically connected to the drain electrode of the TFT 10. Moreover, between any two adjacent scanning lines 14, a storage capacitor line (also referred to as a Cs line) 16 extends in parallel to the scanning lines 14.

In each pixel 10, a storage capacitor (Cs) 18 is formed, and a part of the storage capacitor line 16 serves as a storage capacitor electrode (lower electrode) of the storage capacitor 18. This storage capacitor electrode, a storage capacitor counter electrode (upper electrode), and a layer disposed between both electrodes together constitute a storage capacitor 18. The drain electrode of the TFT 10 is connected to the storage capacitor counter electrode, and the storage capacitor counter electrode is connected to the pixel electrode 20 via a contact hole which is formed in the interlayer insulating layer. The gate electrode of the TFT 10, the scanning line 14, the storage capacitor line 16, and the storage capacitor electrode are made of the same material and through the same step. The source electrode and the drain electrode of the TFT 10, the signal line 12, and the storage capacitor counter electrode are made of the same material and through the same step.

Figure 4:
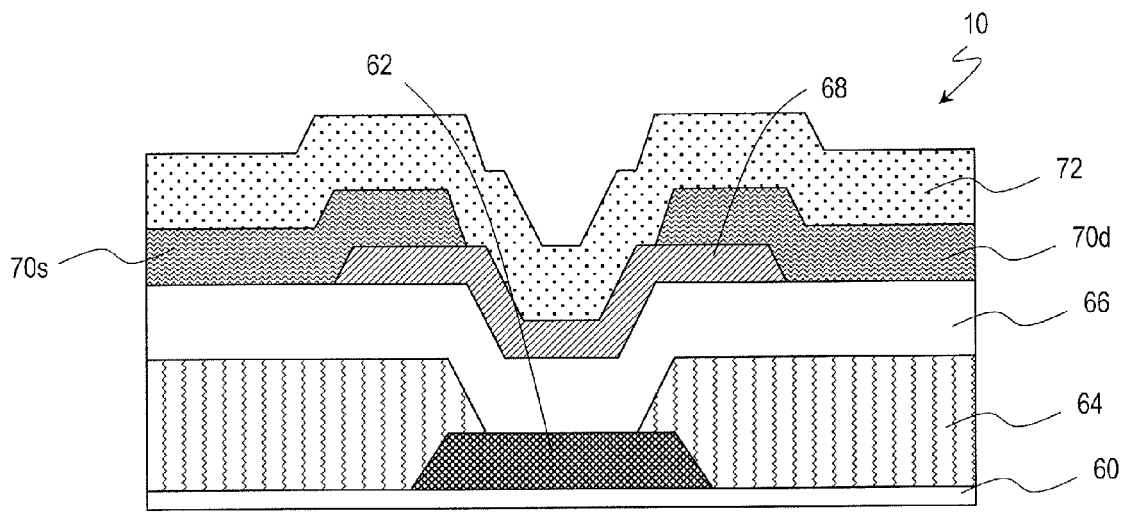
FIG. 4 A cross-sectional view schematically showing the construction of a TFT 10 according to Embodiment 1.

FIG. 4 is a cross-sectional view schematically showing the construction of the TFT 10 on the TFT substrate 100 according to Embodiment 1 (which may also be referred to as the "semiconductor device 100").

As shown in FIG. 4, the TFT 10 includes: a gate electrode 62 formed on a substrate 60 such as a glass substrate; an oxygen supply layer 64 formed on the substrate 60 so as to partially cover the gate electrode 62; a gate insulating layer 66 (which may simply be referred to as the "insulating layer 66") formed on the oxygen supply layer 64; an oxide semiconductor layer 68 formed on the gate insulating layer 66; a source electrode 70s and a drain electrode 70d formed on the gate insulating layer 66 and the oxide semiconductor layer 68; and a protection layer 72 formed on the source electrode 70s and drain electrode 70d.

As will be shown later in FIG. 8(h), a pixel electrode 20 of a transparent electrically conductive material is formed on the protection layer 72. A contact hole 74h is formed in the protection layer 72 under the pixel electrode 20, such that the pixel electrode 20 is in contact with the drain electrode 70d of the TFT 10 at the bottom of the contact hole 74h. Note that a construction where an interlayer insulating layer is disposed between the protection layer 72 and the pixel electrode 20 would also be possible.

The gate electrode 62 may have a two-layer structure where an upper gate electrode of copper (Cu), for example, is formed on a lower gate electrode of titanium (Ti), for example. The gate electrode may have a three-layer construction of Ti/Al(aluminum)/Ti or the like.

The oxygen supply layer 64 is a layer made of a material containing water ($H_2O$), an OR group, or an OH group. In the present embodiment, the oxygen supply layer 64 is formed by applying a spin-on glass (SOG) material containing a silicone resin by spin coating technique, for example. As the SOG material, a material containing silanol ($Si(OH)_4$), alkoxysilane, a siloxane resin, or the like may also be used. The oxygen supply layer 64 may be made of another resin material containing a silanol group or an Si—OH group. Moreover, the oxygen supply layer 64 may be made of an acrylic resin, an ester-polymerization resin, or a resin material containing a CO—OR group.

The gate insulating layer 66 is made of silicon nitride. The gate insulating layer 66 may be made of silicon oxide, and may have a two-layer construction of a silicon nitride layer and a silicon oxide layer. The gate insulating layer 66 is in contact with the gate electrode 62 within an aperture which is formed in the oxygen supply layer 64.

The oxide semiconductor layer 68 is a layer of an In—Ga—Zn—O type semiconductor (IGZO). The source electrode 70s and drain electrode 70d formed on the oxide semiconductor layer 68 are conductive layers having a three-layer construction of Ti/Al/Ti. The source electrode 70s and drain electrode 70d may have a two-layer construction of Al/Ti, Cu/Ti, Cu/Mo (molybdenum), or the like.

The protection layer 72 is made of silicon oxide ($SiO_2$) or silicon nitride ($SiN_x$). A construction omitting the protection layer 72 would also be possible.

Figure 5:
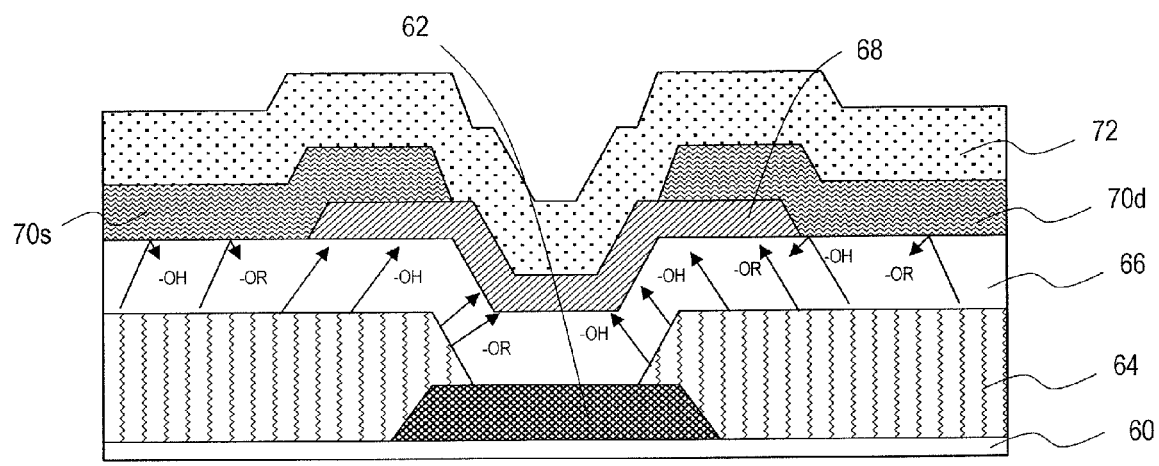
FIG. 5 A cross-sectional view schematically showing the construction of the TFT 10 according to Embodiment 1, for describing effects obtained with the TFT 10.

As shown in FIG. 5, since the oxygen supply layer 64 contains $H_2O$, an OR group, or an OH group, in a heat treatment step such as annealing, the $H_2O$, OH group, or OR group is diffused into the oxide semiconductor layer 68 from the oxygen supply layer 64 via the gate insulating layer 66, thereby making up for the defects associated with oxygen defects or the like in the oxide semiconductor layer 68. Therefore, the TFT characteristics are improved, and a high-quality semiconductor device with little TFT-to-TFT variation can be provided. Moreover, in the TFT 10, the source electrode 70s and drain electrode 70d are formed from an end of the oxide semiconductor layer 64 to over the oxygen supply layer 64 outside thereof. Therefore, the $H_2O$, OR group, or OH group which has migrated from the oxygen supply layer 64 to the gate insulating layer 66 is reflected at the bottom faces of the source electrode 70s and drain electrode 70d, so that parts thereof migrate toward the oxide semiconductor layer 68. Thus, when conducting a heat treatment after forming the source electrode 70s and drain electrode 70d, the source electrode 70s and drain electrode 70d will serve as diffusion prevention layers, thus allowing greater amounts of $H_2O$, an OR group, or an OH group to be supplied to the oxide semiconductor layer 68, and more defects restored.

Figure 6:
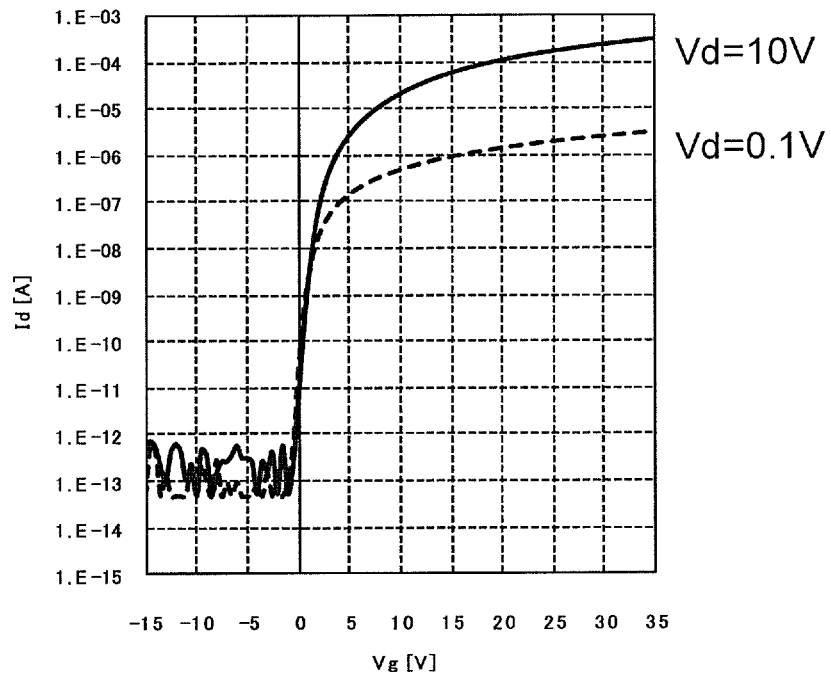
FIGS. 6 (a) and (b) are diagrams for describing effects obtained with the TFT 10, where (a) represents voltage-current characteristics of a TFT having an oxygen supply layer, and (b) represents voltage-current characteristics of a TFT lacking an oxygen supply layer.
Figure 6:
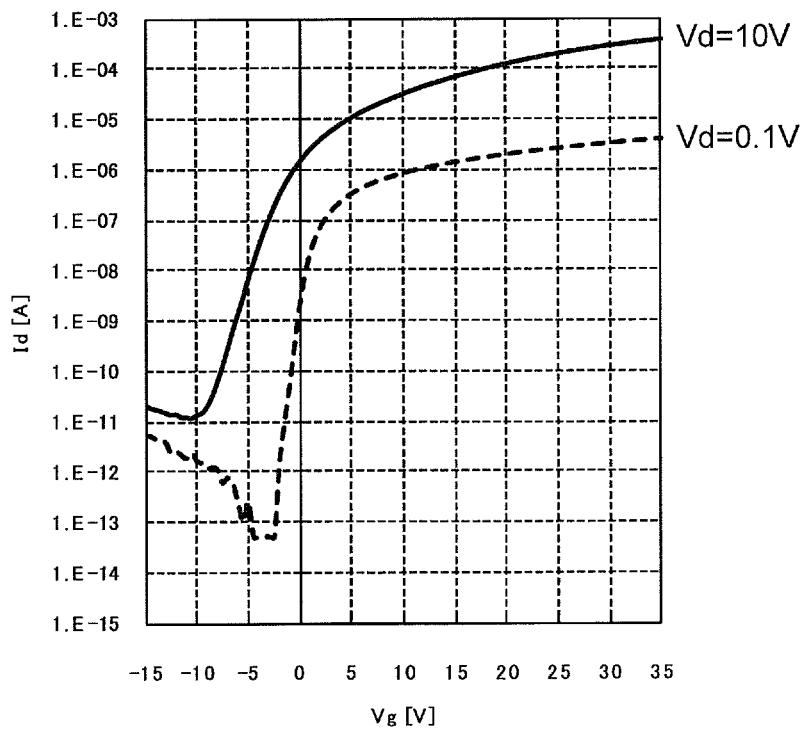

FIG. 6(a) is a graph showing voltage-current characteristics of the TFT 10 of Embodiment 1, and (b) is a graph representing voltage-current characteristics of a TFT lacking an oxygen supply layer. In both graphs, the horizontal axis represents gate voltage values, and the vertical axis represents source-drain current values; and characteristics under a drain voltage of 10 V are indicated by a solid line, while the characteristics under a drain voltage of 0.1 V are indicated by a broken line.

As shown in FIG. 6(a), in the TFT 10 of Embodiment 1, the current rise characteristics (S value) near a gate voltage of 0 V are constant irrespective of the drain voltage, and an appropriate current value which is in accordance with the applied voltage is being obtained once the TFT is ON. On the other hand, as shown in FIG. 6(b), in a TFT lacking an oxygen supply layer, the S value varies for each drain voltage, and there are fluctuations in the rise position of the ON current and in the OFF current value. These comparisons indicate that the TFT 10 having the oxygen supply layer 54 according to Embodiment 1 provides a high-performance semiconductor device with more stable TFT characteristics.

Figure 7:
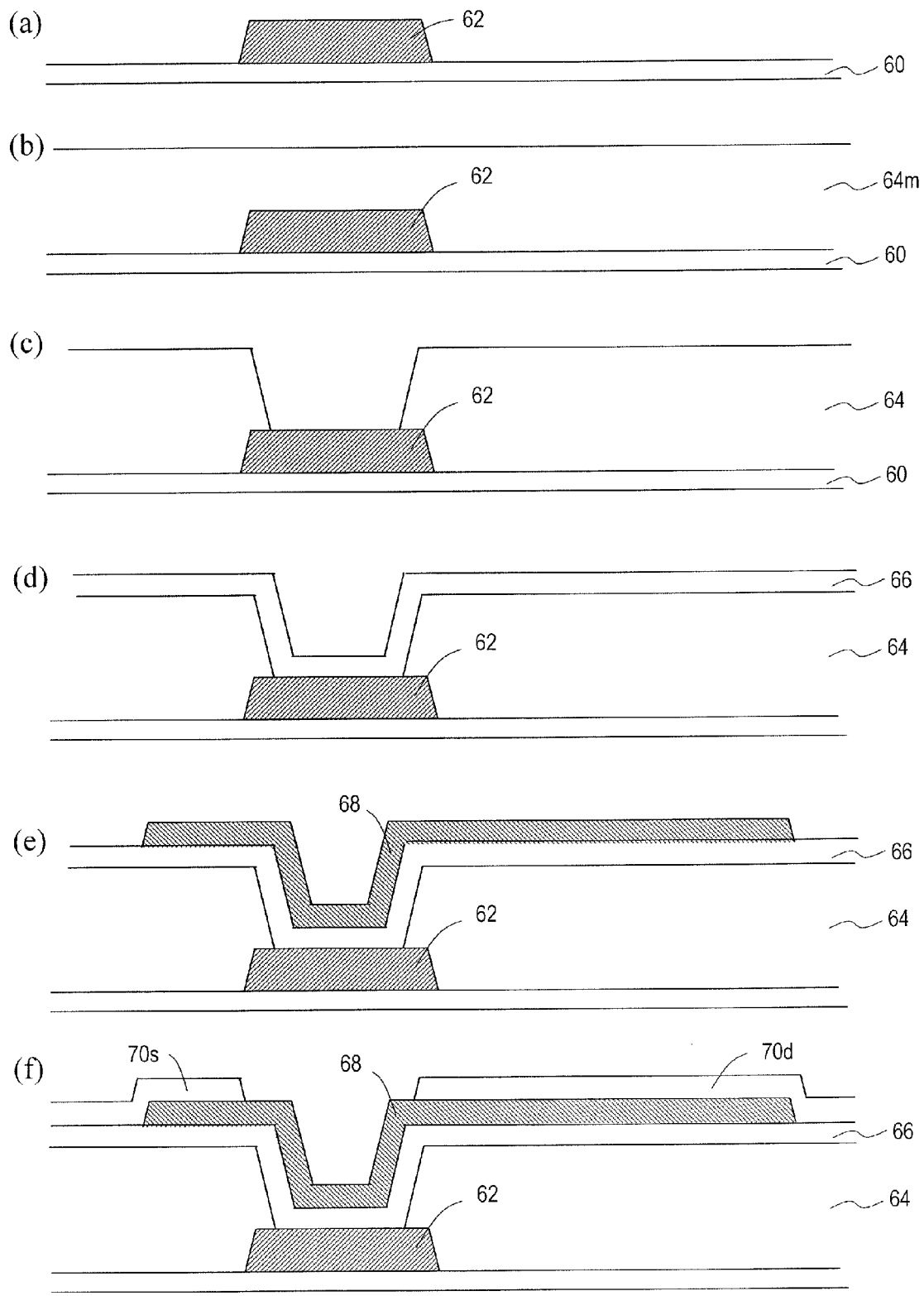
FIG. 7 (a) to (f) are cross-sectional views schematically showing production steps for the TFT substrate 100.
Figure 8:
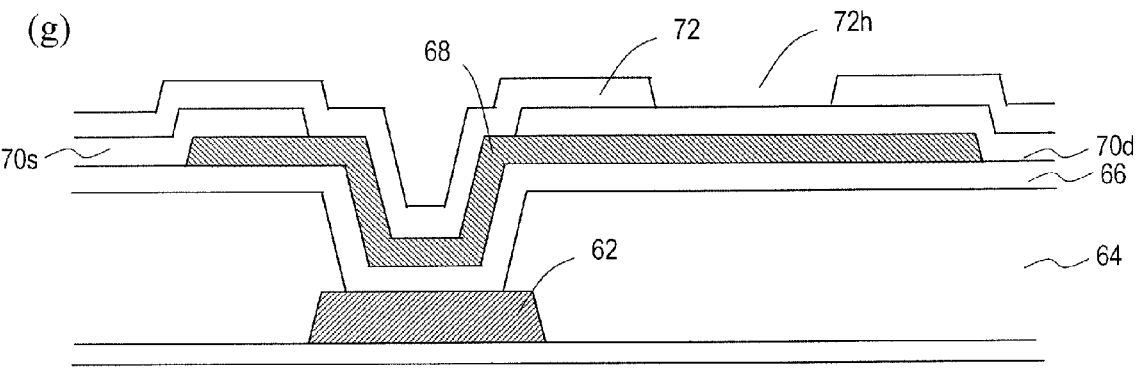
FIGS. 8 (g) and (h) are cross-sectional views schematically showing production steps for the TFT substrate 100.
Figure 8:
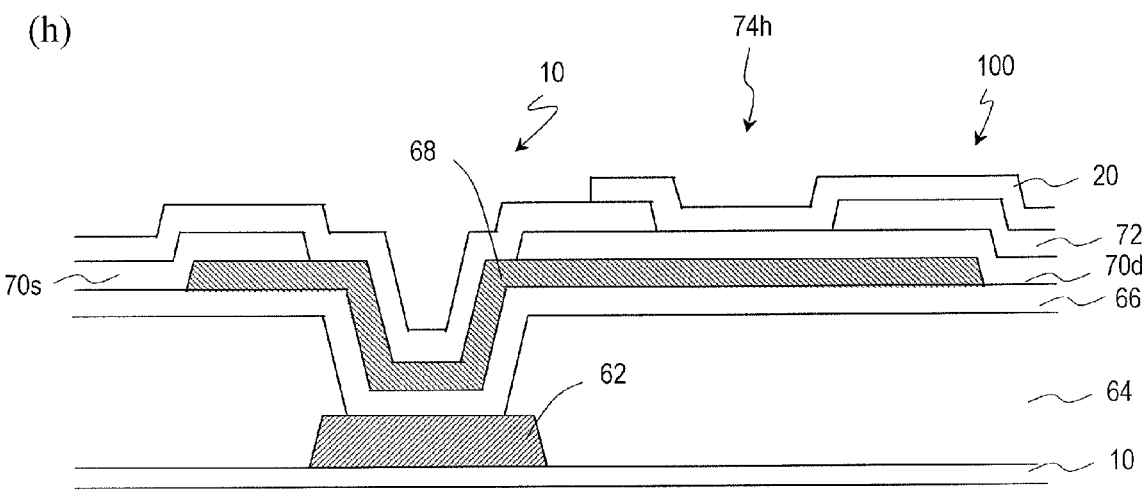

Next, a method for producing the TFT substrate 100F will be described with reference to FIG. 7 and FIG. 8.

FIGS. 7(a) to (f) and FIGS. 8(g) to (h) are schematic cross-sectional views showing production steps for the TFT substrate 100.

Step (A):

First, a Ti layer and a Cu layer are stacked in this order on the substrate 60 by a sputtering technique or the like. The Ti layer has a thickness of 30 to 150 nm, and the Cu layer has a thickness of 200 to 500 nm. Next, the two stacked layers are patterned by using known photolithography and wet etching techniques (first masking step) to obtain a gate electrode 62 shown in FIG. 7(a). At this time, scanning lines 14, storage capacitor lines 16, storage capacitor electrodes, lower connection lines, and the like not shown are also formed at the same time. Thereafter, the remaining resist is removed and the substrate is cleaned.

Step (B):

Next, as shown in FIG. 7(b), by spin coating, an oxygen-supplying material 64m is formed on the substrate 60 so as to cover the gate electrode 62. Herein, a silicone resin or an SOG material is used as the oxygen-supplying material 64m. As the SOG material, a material containing silanol (e.g., $Si(OH)_4$), alkoxysilane, a siloxane resin or the like may also be used. The oxygen supply layer 64 may be made of any other resin material containing a silanol group or an Si—OH group. Moreover, the oxygen supply layer 64 may be made of an acrylic resin, an ester-polymerization resin, or a resin material containing a CO—OR group.

Step (C):

Next, as shown in FIG. 7(c), an aperture is made in the oxygen-supplying material 64m over the gate electrode 62 by a photolithography technique (second masking step), whereby an oxygen supply layer 64 is formed.

Step (D):

Next, as shown in FIG. 7(d), a gate insulating layer 66 is stacked on the oxygen supply layer 64 so as to cover the aperture. The gate insulating layer 66 is a silicon nitride layer which is stacked to a thickness of 100 to 700 nm by a plasma CVD technique. Instead of silicon nitride, silicon oxide ($SiO_2$) may be stacked, or both silicon nitride and silicon oxide may be stacked. Within the aperture of the oxygen supply layer 64, the gate insulating layer 66 is in contact with the gate electrode 62.

Step (E):

Next, an oxide semiconductor is stacked on the gate insulating layer 66. The oxide semiconductor is formed by stacking, for example, an In—Ga—Zn—O type semiconductor (IGZO) to a thickness of 10 to 100 nm using a sputtering technique. The oxide semiconductor may be stacked by an application technique or an ink jet technique.

Thereafter, the stacked oxide semiconductor is patterned by a photolithography technique, e.g., a wet etching technique using oxalic acid (third masking step), thereby obtaining an oxide semiconductor layer 68 to become a channel layer of the TFT 10, as shown in FIG. 7(e). Thereafter, the remaining resist is removed and the substrate is cleaned. As the oxide semiconductor, other types of oxide semiconductor films may be used, instead of IGZO.

Step (F):

Next, by a sputtering technique, Ti, Al, and Ti are stacked in this order on the gate insulating layer 66 so as to cover the oxide semiconductor layer 68. Next, by photolithography and wet etching techniques, these three layers are patterned to obtain the source electrode 70s and drain electrode 70d (fourth masking step), as shown in FIG. 7(f). Thereafter, the remaining resist is removed, and the substrate is cleaned. Dry etching may be used instead of wet etching. Rather than stacking Ti, Al, and Ti, instead, Al/Ti, Cu/Ti, or Cu/Mo may be stacked. In this step, signal lines 12, storage capacitor counter electrodes, upper connection lines, and the like not shown are also formed at the same time.

Step (G):

Next, silicon oxide is stacked on the entire substrate by a CVD technique. Instead of silicon oxide, silicon nitride may be stacked, or both silicon oxide and silicon nitride may be stacked. The layer thus formed is called a PAS film. Thereafter, the PAS film was subjected to an annealing treatment at a temperature of 200° C. to 400° C. in an atmospheric ambient. Through the annealing treatment, a reflective layer is formed between the lower faces of the source electrode 70s and drain electrode 70d and the oxide semiconductor layer 68.

This low-reflection layer is formed as an oxidation-reduction reaction occurs between the titanium composing the lower layers of the source electrode 70s and drain electrode 70d and the oxide semiconductor layer 68, whereby the titanium is oxidized and at the same time the indium in the oxide semiconductor 68 is reduced. If the low-reflection layer did not exist, light originating from the backlight unit and external light such as sunlight that enter the TFT substrate 10 would repeatedly undergo reflection between the lower faces of the source electrode 70s and drain electrode 70d and the upper face of the gate electrode 62, and a large part thereof would reach the channel portion of the oxide semiconductor layer 68 to deteriorate the TFT characteristics. In the TFT 10 of the present embodiment, because of a low-reflection layer being formed as mentioned above, reflection of incident light is prevented, and the amount of light entering the channel portion can be reduced. As a result, a highly-reliable TFT substrate with reduced characteristics variation can be provided.

Thereafter, the stacked PAS film is patterned by a photolithography technique (fifth masking step) to obtain a protection layer 72 shown in FIG. 8(g). Through the patterning, an aperture 72h is formed in the protection layer 72.

Step (H):

Next, on the protection layer 72, a transparent electrically conductive material is deposited by a sputtering technique, for example. At this time, the transparent electrically conductive material is in contact with the drain electrode 70d within the contact hole 74h. ITO is used as the transparent electrically conductive material. IZO, ZnO, or the like may be used as the transparent electrically conductive material. Then, by a known photolithography technique, the transparent electrode layer is patterned (sixth masking step), whereby a pixel electrode 20 is formed as shown in FIG. 8(h).

Through the above steps, the TFT substrate 100 having the TFT 10 is completed.

Figure 9:
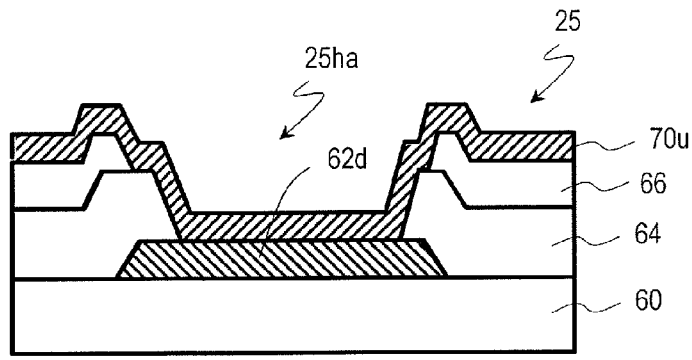
FIG. 9 A cross-sectional view schematically showing a first implementation of a connecting portion between an upper connection line and a lower connection line of the TFT substrate 100.
Figure 10:
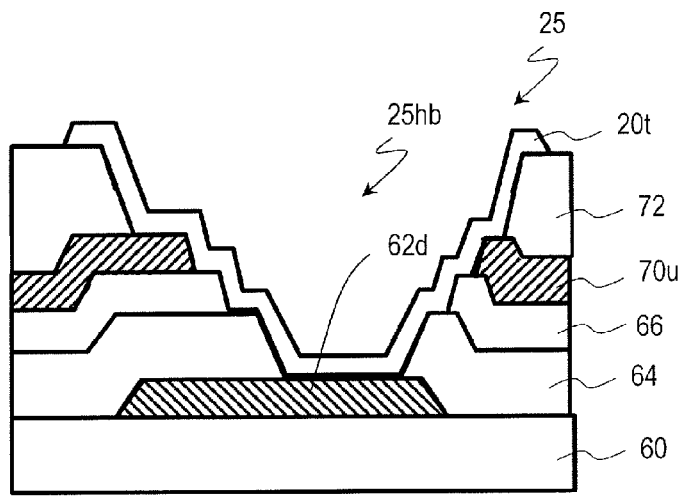
FIG. 10 A cross-sectional view schematically showing a second implementation of a connecting portion of the TFT substrate 100.
Figure 11:
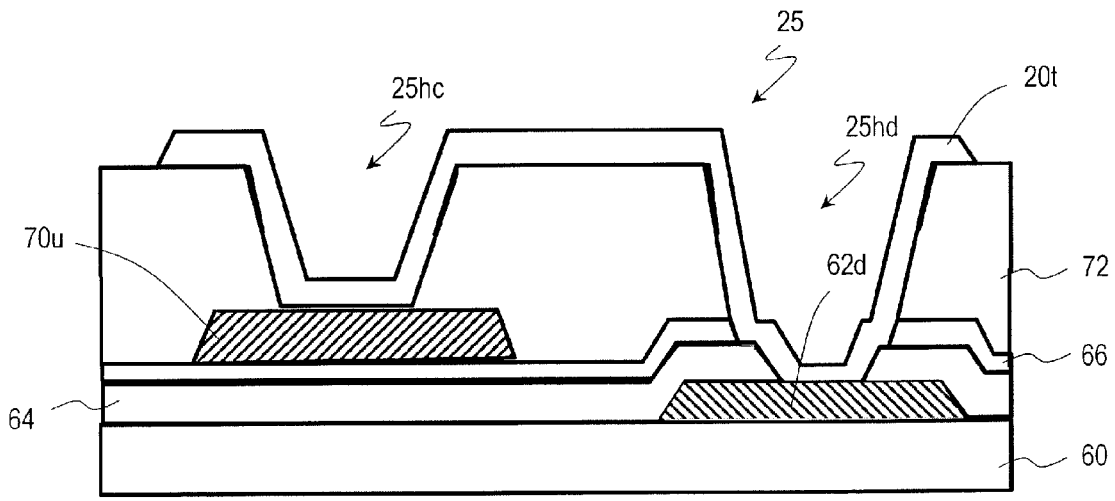
FIG. 11 A cross-sectional view schematically a third implementation of a connecting portion of the TFT substrate 100.

Next, with reference to FIG. 9 to FIG. 11, first to third construction examples of the connecting portion 25 of the TFT substrate 100 will be described. FIG. 9 to FIG. 11 schematically show cross sections of first to third construction examples of the connecting portion 25, respectively.

First Construction Example

The connecting portion 25 according to a first construction example includes, as shown in FIG. 9, a lower connection line 62d formed on the substrate 60, an oxygen supply layer 64 formed on the lower connection line 62d, a gate insulating layer 66 formed on the oxygen supply layer 64, and an upper connection line 70u formed on the gate insulating layer 66. The lower connection line 62d is a metal layer which is made at the same time and of the same material as the gate electrode 62. The upper connection line 70u is a metal layer which is made at the same time and of the same material as the source electrode 70s and drain electrode 70d.

At the connecting portion 25, in each of the oxygen supply layer 64 and the gate insulating layer 66, an aperture is made at a mutually overlapping position, with a contact hole 25ha being made so as to penetrate through these two layers. The aperture in the gate insulating layer 66 is larger than the aperture in the oxygen supply layer 64, and in the contact hole 25ha, side faces of the gate insulating layer 66 and the oxygen supply layer 64 are formed in step shapes. The upper connection line 70u and the lower connection line 62d are connected via the contact hole 25ha. In other words, the upper connection line 70u formed in the contact hole 25ha is connected to the lower connection line 62d at the bottom of the contact hole 25ha.

When stacking the metal layer of the upper connection line 70u, if the side face of the contact hole 25ha is a steep slope, the metal layer is likely to be disrupted at the side face, so that line breaking may occur at the connecting portion. In this construction example, the upper connection line 70u is formed on the step-shaped side faces of the gate insulating layer 66 and the oxygen supply layer 64, rather than on a side face with a steep gradient; therefore, disruption of the upper connection line 70u is unlikely to occur. Therefore, a highly-reliable connecting portion 25 can be formed.

Second Construction Example

The connecting portion 25 according to a second construction example includes, as shown in FIG. 10, a lower connection line 62d formed on the substrate 60, an oxygen supply layer 64 formed on the lower connection line 62d, an gate insulating layer 66 formed on the oxygen supply layer 64, an upper connection line 70u formed on the gate insulating layer 66, a protection layer 72 formed on the upper connection line 70u, and a conductive layer 20t formed on the protection layer 72. The lower connection line 62d is a metal layer which is made at the same time and of the same material as the gate electrode 62, whereas the upper connection line 70u is a metal layer which is made at the same time and of the same material as the source electrode 70s and drain electrode 70d. The conductive layer 20t is made at the same time and of the same material as the pixel electrode 20.

At the connecting portion 25, in each of the oxygen supply layer 64, the gate insulating layer 66, the upper connection line 70u, and the protection layer 72, an aperture is made at a mutually overlapping position. The aperture is formed so as to increase in size from lower layers to upper layers, and a contact hole 25hb is formed so as to penetrate through these layers. In the contact hole 25hb, the ends of the layers are formed in step shapes, so as to be located increasingly outside in increasingly upper layers.

The upper connection line 70u and the lower connection line 62d are connected via the conductive layer 20t in the contact hole 25hb. In other words, in the contact hole 25hb, the conductive layer 20t is formed so as to cover the side faces of the oxygen supply layer 64, the gate insulating layer 66, the upper connection line 70u, and the protection layer 72. At these side faces, the conductive layer 20t and the upper connection line 70u are connected; and the conductive layer 20t and the lower connection line 62d are connected at the bottom of the contact hole 25ha.

When forming the conductive layer 20t in the contact hole 25hb, a metal such as ITO or IZO is stacked by a sputtering technique. If the side face of the contact hole 25ha is a steep slope, disruption of the metal layer or insufficient contact between the metal layer and the upper connection line 70u is likely to occur. Moreover, trying to form the layers so that their ends are at the same position might result in the end of a lower layer being formed outside the end of an upper layer, owing to mask misalignment in photolithography, variations in etching shift, overhang, and so on; this causes line breaking in the conductive layer 20t.

In this construction example, since the side faces of the layers are formed so as to be located increasingly outside in increasingly upper layers, the side face of the contact hole 25hb is formed in step shapes, thereby preventing line breaking of the conductive layer 20t and insufficient contact between the conductive layer 20t and the upper connection line 70u. Moreover, since connection at a site of multilayer construction is achieved via a single contact hole, the connecting portion can be reduced in area. This allows for higher density and downsizing of the TFT substrate. Moreover, the contact hole 25hb can be formed by performing a batch etching of the respective layers by utilizing half-tone exposure, resist ashing, or the like. In this case, the production efficiency is improved, and the TFT substrate can be produced at low cost.

Third Construction Example

The connecting portion 25 according to a third construction example includes, as shown in FIG. 11, a lower connection line 62d formed on the substrate 60, an oxygen supply layer 64 formed on the lower connection line 62d, an gate insulating layer 66 formed on the oxygen supply layer 64, an upper connection line 70u formed on the gate insulating layer 66, a protection layer 72 formed on the upper connection line 70u, and a conductive layer 20t formed on the protection layer 72. The lower connection line 62d is a metal layer which is made at the same time and of the same material as the gate electrode 62, whereas the upper connection line 70u is a metal layer which is made at the same time and of the same material as the source electrode 70s and drain electrode 70d. The conductive layer 20t is made at the same time and of the same material as the pixel electrode 20.

In the connecting portion 25, a first contact hole 25hc penetrating through the protection layer 72, and a second contact hole 25hd penetrating through the protection layer 72, the gate insulating layer 66, and the oxygen supply layer 64, are formed. The upper connection line 70u and the conductive layer 20t are connected within the first contact hole 25hc. In other words, in the contact hole 25hc, the conductive layer 20t is formed so as to cover the side face of the protection layer 72, such that the conductive layer 20t and the upper connection line 70u are connected at the bottom of the contact hole 25hc. The conductive layer 20t and the lower connection line 62d are connected within the second contact hole 25hd. In other words, in the contact hole 25hd, the conductive layer 20t is formed so as to cover the side faces of the protection layer 72, the gate insulating layer 66, and the oxygen supply layer 64, such that the conductive layer 20t and the lower connection line 62d are connected at the bottom of the contact hole 25hd.

In this manner, the upper connection line 70u and the lower connection line 62d are electrically connected via the conductive layer 20t. Similarly to the first and second construction examples, the side faces of the contact holes 25hc and 25hd may be formed in step shapes, whereby line breaking of the conductive layer 20t can be prevented.

Next, other embodiments of the present invention (Embodiments 2 to 5) will be described. In the following description, identical reference numerals will be given to constituent elements which are identical to those in Embodiment 1, and the detailed descriptions thereof will be omitted. Similar effects can be obtained from constituent elements of similar construction.

Embodiment 2

Figure 12:
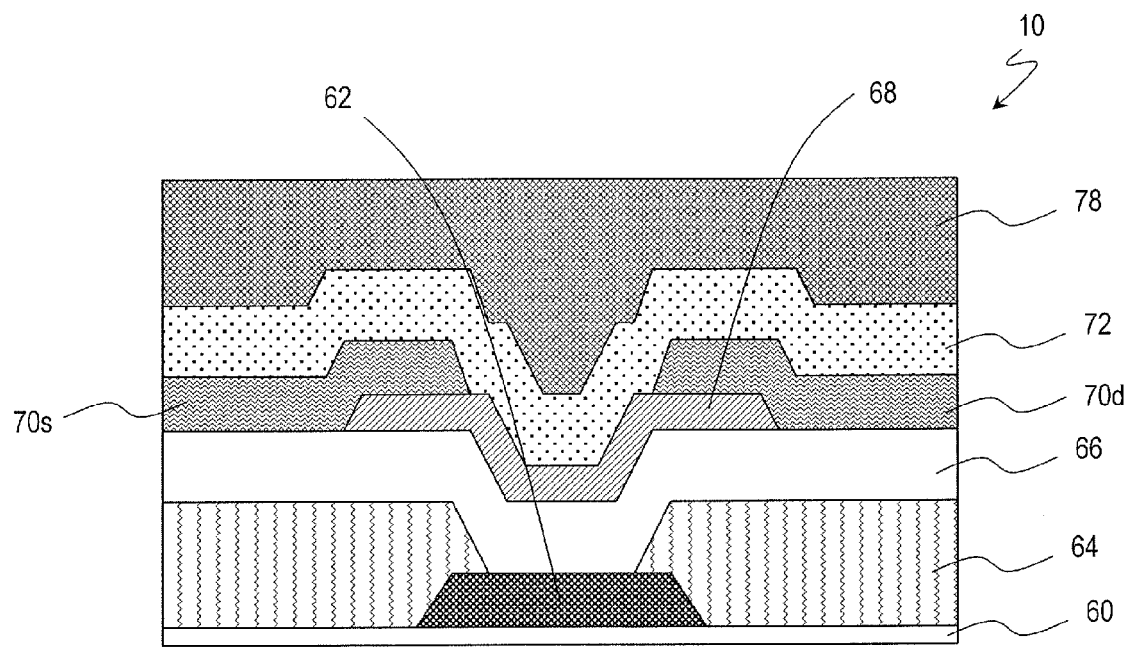
FIG. 12 A cross-sectional view schematically showing the construction of a TFT 10 according to Embodiment 2 of the present invention.

FIG. 12 is a cross-sectional view schematically showing the construction of a TFT 10 according to Embodiment 2. Unless otherwise described below, the basic construction of the TFT substrate in the present embodiment is identical to that of the TFT substrate 100 of Embodiment 1.

As shown in FIG. 12, similarly to Embodiment 1, the TFT 10 includes a gate electrode 62, an oxygen supply layer 64, a gate insulating layer 66, an oxide semiconductor layer 68, a source electrode 70s and a drain electrode 70d, and a protection layer 72, which are successively stacked on a substrate 60. Furthermore, the TFT 10 of the present embodiment includes a second oxygen supply layer 78 formed on the protection layer 72. An implementation in which no protection layer 72 is formed is also encompassed by the TFT 10 of the present embodiment. The second oxygen supply layer 78 is formed in the place of the interlayer insulating layer 74 of Embodiment 1. An interlayer insulating layer 74 may possibly be formed on the second oxygen supply layer 78.

The second oxygen supply layer 78 is formed by, for example, applying an acrylic resin by a spin coating technique at step (H) in Embodiment 1. Instead of an acrylic resin, an SOG material containing a silicone resin or the like may be used. Similarly to the oxygen supply layer 64, the second oxygen supply layer 78 is a layer made of a material containing $H_2O$, an OR group, or an OH group, and may be made of the material for the oxygen supply layer 64 described in Embodiment 1.

With the TFT 10 of Embodiment 2, $H_2O$, an OR group, or an OH group can be supplied to the channel portion of the oxide semiconductor layer 68 not only from the oxygen supply layer 64 but also from the second oxygen supply layer 78. Therefore, an oxide semiconductor layer 68 in which defects are better restored than in Embodiment 1 can be obtained, and a highly-reliable semiconductor device with even better TFT characteristics can be obtained.

Embodiment 3

Figure 13:
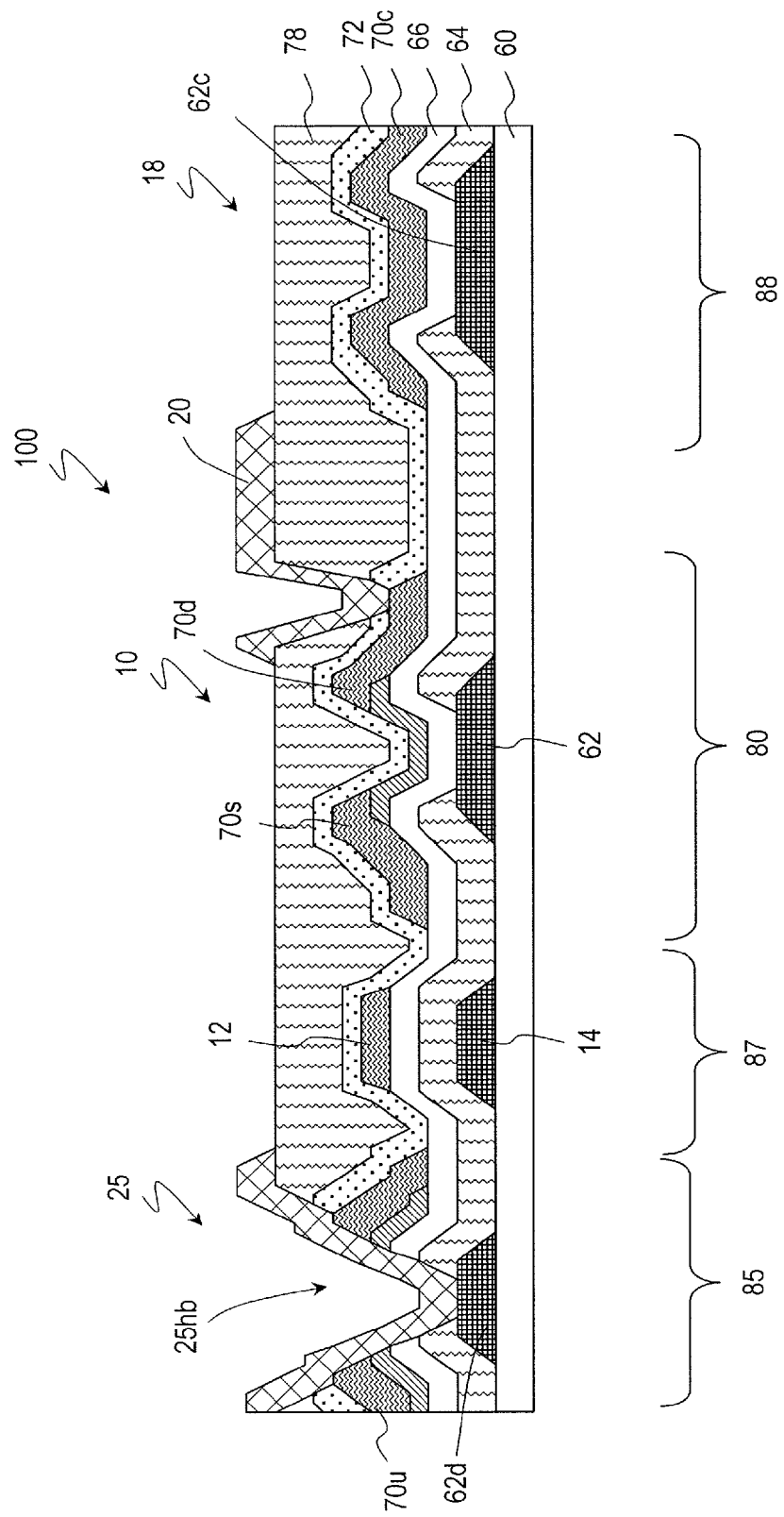
FIG. 13 A cross-sectional view schematically showing the construction of a TFT substrate 100 according to Embodiment 3 of the present invention.

FIG. 13 is a cross-sectional view schematically showing the construction of a TFT substrate 100 according to Embodiment 3. Unless otherwise described below, the TFT substrate 100 of the present embodiment is identical in basic construction to the TFT substrate 100 of Embodiment 1, and may be employed as the TFT substrate 100 shown in FIG. 1 and FIG. 2.

As shown in FIG. 13, the TFT substrate 100 includes a contact portion 85, a line crossing portion 87, a TFT portion 80, and a Cs portion 88. In the contact portion 85, a connecting portion 25 is formed; in the TFT portion 80, a TFT 10 is formed; and in the Cs portion 88, a storage capacitor 18 is formed. The line crossing portion 87 is a site at which the signal line 12 as an overlying connection line and the scanning line 14 as an underlying connection line intersect each other.

The connecting portion 25 in the contact portion 85 is basically identical in construction to the connecting portion 25 of the second construction example according to Embodiment 1. However, instead of the interlayer insulating layer 74 in the second construction example, a second oxygen supply layer 78 is stacked. In the connecting portion 25 of the present embodiment, too, a plurality of layers are formed so as to be located increasingly outside in increasingly upper layers at the side face of the contact hole 25hb; as a result, the side face of the contact hole 25hb is formed in step shapes, thereby preventing line breaking of the conductive layer 20t and insufficient contact between the conductive layer 20t and the upper connection line 70u. Moreover, since line connection is achieved via a single contact hole, the connecting portion can be reduced in area. The connecting portion 25 of the first or third construction example according to Embodiment 1 may be formed in the contact portion 85.

The line crossing portion 87 includes a substrate 60, a scanning line 14 formed on the substrate 60, an oxygen supply layer 64 stacked so as to cover the scanning line, a gate insulating layer 66 formed on the oxygen supply layer 64, a signal line 12 formed on the gate insulating layer 66, a protection layer 72 formed so as to cover the signal line 12, and a second oxygen supply layer 78 formed on the protection layer. By disposing the oxygen supply layer 64 in between the scanning line 14 and the signal line 12, the parasitic capacitance created between these lines can be reduced.

In the TFT portion 80, the TFT 10 of Embodiment 2 is formed. A drain electrode 70d and a pixel electrode 20 of the TFT 10 are connected via a contact hole which is formed in the protection layer 72 and the second oxygen supply layer 78.

In the Cs portion 88, a storage capacitor electrode 62c, the oxygen supply layer 64, the gate insulating layer 66, a storage capacitor counter electrode 70c, the protection layer 72, and the second oxygen supply layer 78 are stacked in this order. The storage capacitor 18 is constituted by the storage capacitor electrode 62c, the opposing storage capacitor counter electrode 70c, and the gate insulating layer 66 sandwiched between these electrodes. Between these electrodes, an aperture in the oxygen supply layer 64 is formed, with the gate insulating layer 66 being formed so as to fill this aperture. Since this allows the interspace between both electrodes, it is possible to form a storage capacitor 18 having a large capacitance in a narrow region in the TFT substrate 100 of a multi-layer construction including the oxygen supply layer 64, too.

Embodiment 4

Figure 14:
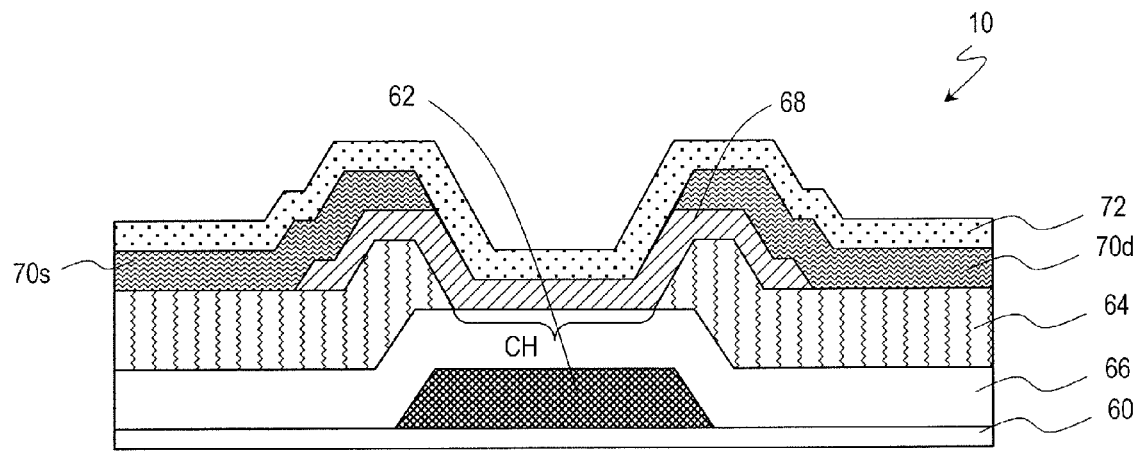
FIG. 14 A cross-sectional view schematically showing the construction of a TFT 10 according to Embodiment 4 of the present invention.

FIG. 14 is a cross-sectional view schematically showing the construction of a TFT 10 according to Embodiment 4. Unless otherwise described below, the basic construction of the TFT substrate in the present embodiment is identical to that of the TFT substrate 100 of Embodiment 1.

As shown in FIG. 14, the TFT 10 includes a gate electrode 62 formed on a substrate 60, a gate insulating layer 66 stacked so as to cover the gate electrode 62, an oxygen supply layer 64 formed on the gate insulating layer 66, an oxide semiconductor layer 68 formed on the oxygen supply layer 64, a source electrode 70s and a drain electrode 70d formed on the oxide semiconductor layer 68, and a protection layer 72 stacked on these electrodes.

In the TFT 10 of the present embodiment, the oxygen supply layer 64 is disposed between the gate insulating layer 66 and the oxide semiconductor layer 68. The oxygen supply layer 64 has an aperture above the gate insulating layer 66 over the gate electrode 62, in which aperture the oxide semiconductor layer 68 is in contact with the gate insulating layer 66. The portion of the oxide semiconductor layer 68 that is in contact with the gate insulating layer 66 is a portion corresponding to the channel portion CH of the TFT 10. Any other portion of the oxide semiconductor layer 68 is directly in contact with the oxygen supply layer 64.

In the production of the TFT 10, at step (B) described in Embodiment 1, the gate insulating layer 66 is stacked on the substrate 60 so as to cover the gate electrode 62, by a CVD technique. Next, an oxygen-supplying material is applied on the gate insulating layer 66 by a spin coating technique or the like. A similar material to what is described in Embodiment 1 is used as the oxygen-supplying material 64m. Next, at step (C), the oxygen-supplying material is patterned by a photolithography technique (second masking step), whereby the oxygen supply layer 64 is completed. During the patterning, an aperture is provided above the gate electrode 62.

In the present embodiment, since the oxide semiconductor layer 68 has a portion which is directly in contact with the oxygen supply layer 64, oxygen is supplied from the oxygen supply layer 64 to the oxide semiconductor layer 68 with a high efficiency. Therefore, a high-performance TFT whose defects are better restored can be provided.

In a construction where the oxygen supply layer 64 is directly in contact with the channel portion CH of the oxide semiconductor layer 68, a large amount of impurity exists in the oxygen supply layer 64, and diffusion of such impurity may possibly lower the reliability of the TFT. Therefore, a layer with little impurity, e.g., a silicon oxide film, is preferably disposed at the site which is in contact with the channel portion CH. According to the present embodiment, the oxide semiconductor layer 68 in the channel portion CH is not directly in contact with the oxygen supply layer 64, but is in contact with the gate insulating layer 66, which is a silicon oxide film or the like; therefore, the TFT reliability can be further enhanced.

Furthermore, the gate insulating layer 66 of silicon oxide, silicon nitride, or the like is formed at the opposite side of the oxygen supply layer 64 from the oxide semiconductor layer 68. The gate insulating layer 66 of such material has a function of restricting diffusion of $H_2O$ or the like. Thus, since greater amounts of $H_2O$, an OR group, or an OH group can be migrated from the oxygen supply layer 64 to the oxide semiconductor layer 68, an oxide semiconductor layer 68 whose defects are better restored can be obtained.

Embodiment 5

Next, an organic EL display device 1002 according to Embodiment 5 of the present invention will be described.

Figure 15:
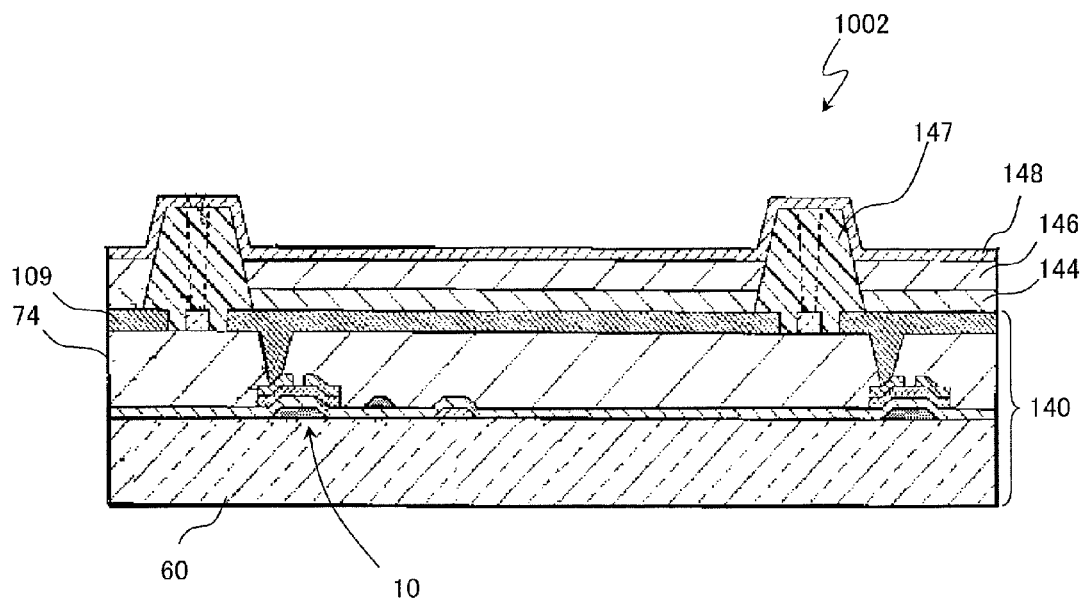
FIG. 15 A cross-sectional view schematically showing the construction of an organic EL display device 1002 according to Embodiment 5 of the present invention.
Figure 16:
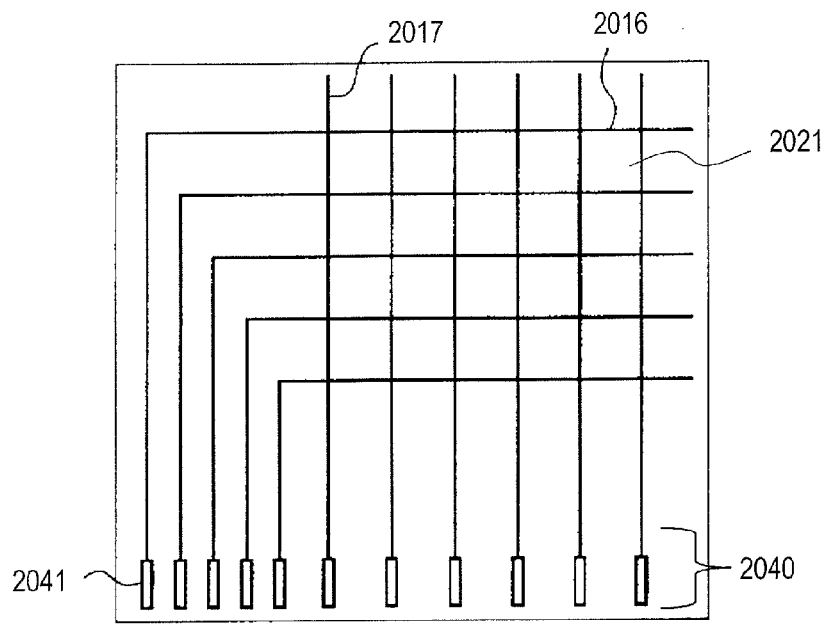
FIG. 16 (a) is a schematic plan view generally showing a conventional TFT substrate; and (b) is an enlarged plan view showing one pixel of the TFT substrate of (a).
Figure 16:
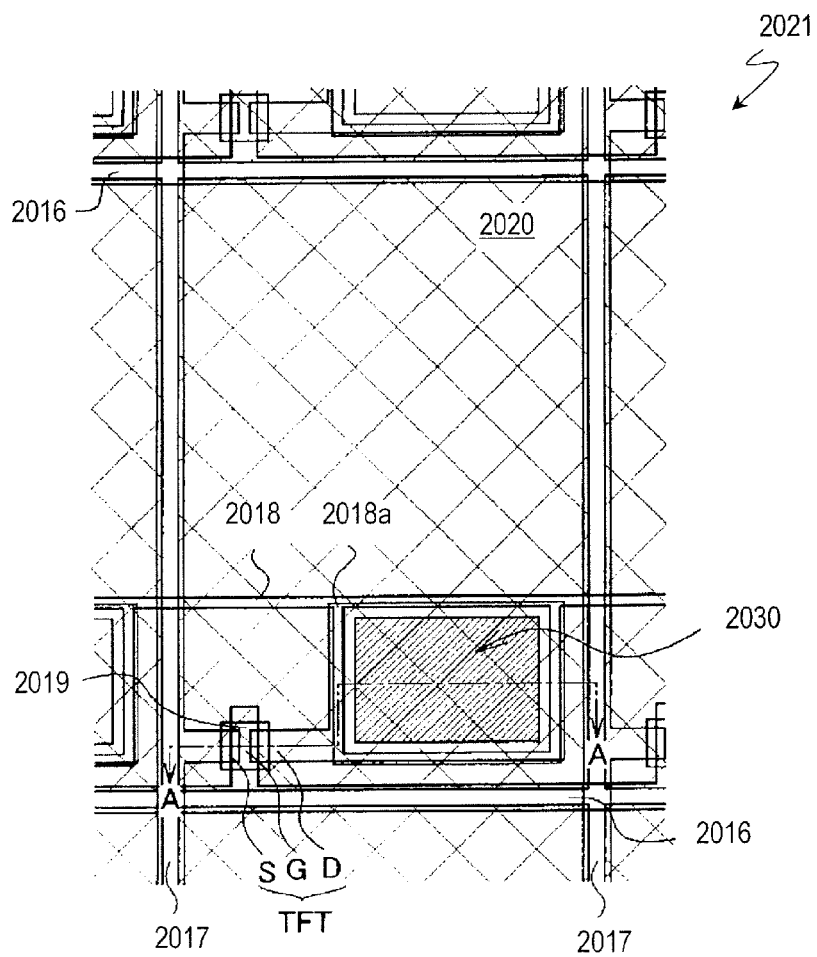
Figure 17:
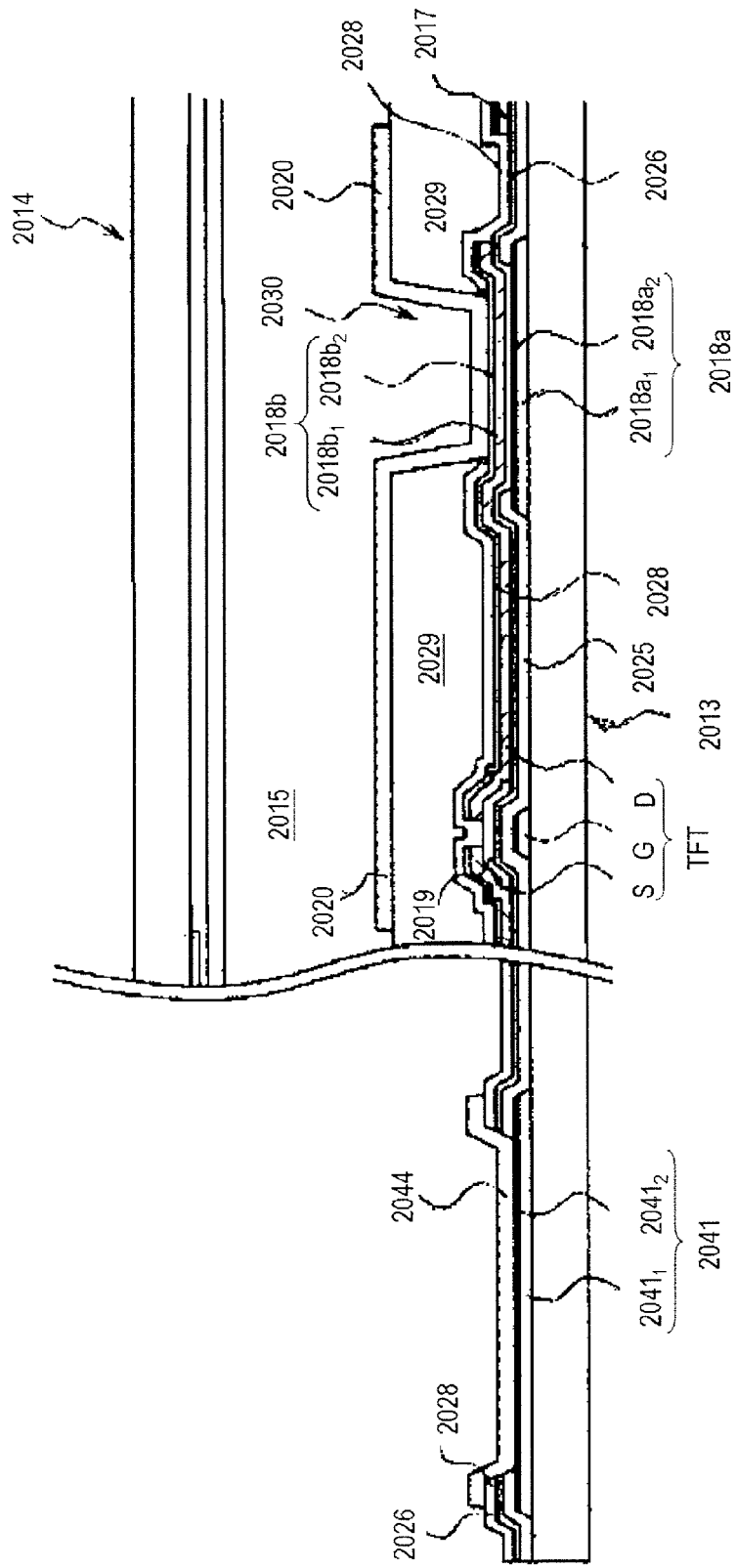
FIG. 17 A cross-sectional view of a TFT and a terminal portion of the conventional TFT substrate shown in FIG. 16.

FIG. 15 is a cross-sectional view schematically showing the construction of an organic EL display device 1002 (which may be simply referred to as "display device 1002"). As shown in the figure, the display device 1002 includes a TFT substrate 140, a hole transport layer 144 provided on the TFT substrate 140, a light emission layer 146 provided on the hole transport layer 144, and a counter electrode 108 provided on the light emission layer 146. The hole transport layer 144 and the light emission layer 146 constitute an organic EL layer. The organic EL layer is partitioned by insulative protrusions 147, such that each partitioned organic EL layer defines the organic EL layer of one pixel.

The TFT substrate 140 basically has the same construction as the TFT substrates 100 of Embodiments 1 to 4, and includes TFTs 10 formed on a substrate 60. As the TFTs 10, the TFTs 10 which are described in Embodiments 1 to 4 can be used. The TFT substrate 140 includes an interlayer insulating layer 74 stacked so as to cover the TFTs 10 and pixel electrodes 109 which are formed on the interlayer insulating layer 74. Each pixel electrode 109 is connected to a drain electrode of the TFT 10 within a contact hole which is formed in the interlayer insulating layer 74. The planar construction of the TFT substrate 140 is basically the same as that shown in FIGS. 2 and 3, and the description thereof is omitted. Note that the TFT substrate 140 may lack the storage capacitors 20.

When a voltage is applied across the organic EL layer by a pixel electrode 109 and the counter electrode 148, holes occurring at the pixel electrode 109 are sent via the hole transport layer 144 to the light emission layer 146. At the same time, electrons occurring at the counter electrode 148 move to the light emission layer 146, and light emission occurs in the light emission layer 146 through recombination of such holes and electrons. Desired displaying is achieved by controlling light emission in the light emission layer 146 for each pixel by using the TFT substrate 140, which is an active matrix substrate.

Known materials and structures may be employed for the materials of the hole transport layer 144, the light emission layer 146, and the counter electrode 148, and their layer structures. It is possible to provide a hole injection layer between the hole transport layer 144 and the light emission layer 146 for an improved hole injection efficiency. In order to enhance the efficiency of light emission and achieve a high electron injection efficiency into the organic EL layer, it is preferable to use a material with a high transmittance and a small work function for the counter electrode 148.

Since TFTs 10 as described in Embodiments 1 to 4 are used in the organic EL display device 1002 of the present embodiment, effects similar to those described in Embodiments 1 to 4 are obtained. According to the present embodiment, an organic EL display device 1002 capable of high-performance displaying can be provided with a good production efficiency.

INDUSTRIAL APPLICABILITY

The present invention is suitably used for a semiconductor device having thin film transistors, a liquid crystal display device having thin film transistors on a TFT substrate, and a display device such as an organic EL display device.

REFERENCE SIGNS LIST

10 TFT (thin film transistor)
12 signal line
14 scanning line
16 storage capacitor line
18 storage capacitor
20 pixel electrode
25 connecting portion 30 terminal portion
50 pixel
60 substrate
62 gate electrode
62c storage capacitor electrode
62d lower connection line
64 oxygen supply layer
66 gate insulating layer
68, 78 oxide semiconductor layer
70c storage capacitor counter electrode
70d drain electrode
70s source electrode
70u upper connection line
72 protection layer
78 second oxygen supply layer
80 TFT portion
85 contact portion
87 line crossing portion
88 Cs portion
100 TFT substrate (semiconductor device)
200 counter substrate
210, 220 polarizer
230 backlight unit
240 scanning line driving circuit
250 signal line driving circuit
260 control circuit
1000 liquid crystal display device
1002 organic EL display device

The invention claimed is:

1. A semiconductor device having a thin film transistor, comprising:
    a gate electrode of the thin film transistor, the gate electrode being formed on a substrate;
    a gate insulating layer formed on the gate electrode;
    an oxygen supply layer formed on the gate insulating layer;
    an oxide semiconductor layer of the thin film transistor, the oxide semiconductor layer formed on the oxygen supply layer; and
    a source electrode and a drain electrode of the thin film transistor, the source electrode and the drain electrode being disposed on the oxide semiconductor layer, wherein,
    an aperture is formed in the oxygen supply layer; and
    the oxide semiconductor layer is in contact with the gate insulating layer in the aperture of the oxygen supply layer.

2. The semiconductor device of claim 1, wherein the oxygen supply layer is a layer made of a material containing water ($H_2O$), an OR group, or an OH group.

3. The semiconductor device of claim 1, wherein the oxygen supply layer is made of a silicone resin, or a resin material containing a silanol group or an Si—OH group.

4. The semiconductor device of claim 1, wherein the oxygen supply layer is made of an ester-polymerization resin, or a resin material containing a CO—OR group.

5. The semiconductor device of claim 1, wherein the oxygen supply layer is made of an acrylic resin or a material containing an SOG material.

6. A display device comprising the semiconductor device of claim 1.

7. The semiconductor device of claim 1, wherein the oxide semiconductor layer is a layer of an In—Ga—Zn—O type semiconductor.

* * * * *